United States Patent [19]

Haisma et al.

[11] 4,151,602

[45] Apr. 24, 1979

[54] MAGNETIC BUBBLE MULTILAYER ARRANGEMENT

[75] Inventors: Jan Haisma; Klaas L. L. Van Mierloo; Ulrich E. Enz; Piet F. Bongers, all of Eindhoven, Netherlands

[73] Assignee: U.S. Philips Corporation, New York, N.Y.

[21] Appl. No.: 878,822

[22] Filed: Feb. 17, 1978

Related U.S. Application Data

[63] Continuation of Ser. No. 564,327, Apr. 2, 1975, abandoned.

[51] Int. Cl.² .................................................. G11C 19/08
[52] U.S. Cl. ........................................ 365/32; 365/3; 365/13; 365/29; 365/33; 365/41
[58] Field of Search ................................ 365/3, 32, 29

[56] References Cited

U.S. PATENT DOCUMENTS

| | | | |
|---|---|---|---|
| 3,810,131 | 5/1974 | Ashkin et al. | 365/33 |
| 3,845,477 | 10/1974 | LeCraw | 365/15 |
| 3,887,905 | 6/1975 | Bobeck et al. | 365/32 |
| 3,940,631 | 2/1976 | Bailey | 365/16 |

OTHER PUBLICATIONS

IEEE Transaction on Magnetics—vol. Mag-9, No. 3, Sep. 1973, pp. 422–425.
IEEE Transactions on Magnetics—vol. Mag. 10, No. 3, Sep. 1974, pp. 630–633.

*Primary Examiner*—James W. Moffitt
*Attorney, Agent, or Firm*—Carl P. Steinhauser

[57] ABSTRACT

A magnetic bubble device comprising a non-magnetic substrate layer, and a sequence of magnetic layers joined to each other and to the magnetic substrate layer, e.g. by epitaxial growing of crystalline layers, whereby at least two of the magnetic layers may accommodate magnetic bubbles which are stably joined through an interlayer magnetic compensation wall, or by an essentially finite potential barrier.

23 Claims, 10 Drawing Figures

MAGNETIC BUBBLE MULTILAYER ARRANGEMENT

This is a continuation of application Ser. No. 564,327, filed Apr. 2, 1975 and now abandoned.

The invention relates to a magnetic bubble device. Magnetic bubbles have been studied for their promising properties. These relate to an easy and fast displacement, non-volatility under power interrupts, high density and easy detection both by optical and electrical means, or a combination of the above. Also promising collective properties of magnetic bubbles have been published. Magnetic bubbles may have several shapes, notably of rings and circular domains. Magnetic bubbles have been proposed as a vehicle for high-density storage of digital intelligence. Magnetic bubbles have been proposed for display devices, based on the phenomenon that they can be detected or made visible by virtue of the Faraday rotation and/or reflected light therein. Therefore, the rotation of the polarization vector of polarized light can be detected as an indication of the presence or absence of a magnetic bubble at a predetermined location. The present invention renders improvement on existing magnetic schemes by enhancing the information content of a magnetic bubble location. A further object is to provide improved stability of an arrangement of a plurality of magnetic bubbles disposed in more than one magnetic layer. A further object of the invention is the provision of a device wherein a single magnetic bubble location may give rise to at least three different values of the incurred total Faraday rotation of polarized light transmitted therethrough as depending on the presence of a single magnetic bubble or a superposed magnetic bubble arrangement on said location or the absence of said magnetic bubbles thereon. A further object of the invention is to provide a magnetic joined multilayer arrangement whereby magnetic bubbles may be generated arbitrarily in one or more layers and whereby non-superposed magnetic bubbles are subject to mutually repelling forces. The invention provides a magnetic bubble device comprising: a non-magnetic substrate layer, a first magnetic layer joined thereto capable of accommodating magnetic bubbles, a second magnetic layer joined to said first magnetic layer capable of accommodating further magnetic bubbles, magnetic field generating means for generating a steady magnetic field component directed substantially transverse to said layers, first generator means for serially generating a plurality of magnetic bubbles in said first magnetic layer, second generator means for serially generating a plurality of magnetic bubbles in said second magnetic layer, control means for selectively controlling cooperation between said first and second generator means for generating superposed magnetic bubbles in said first and second magnetic layers which superposed magnetic bubbles are energetically joined through a magnetic compensation wall, whereby non-cooperation between said first and second generator means produces mutually repelling single magnetic bubbles in any of said magnetic layers which are furthermore repelling towards any superposed magnetic bubble arrangement, said device furthermore comprising transport means for providing a relative displacement between said first and second generator means and any magnetic bubble having been generated thereby, whereby said magnetic layers each accommodate at least two magnetic crystalline sublatices having respective first and second complementary magnetizations which are directed in opposition with each other, said device furthermore comprising detector means for selectively detecting single or superposed magnetic bubbles.

Preferably, said magnetic crystalline sublattices each have specific optical activities, which per magnetic layer are complementary and in opposition with each other, whereby said magnetic layers are doped for producing per layer at corresponding magnetizations a respective different optical activity, and whereby said detector means is adapted for specifically discriminating any of a predetermined number of Faraday rotation vectors. Preferably said first and second generator means are stationary with respect to said magnetic layers, whereby said device furthermore comprises magnetic bubble propagation means.

Alternatively, a sequence of mutually joined magnetic layers could be provided on the non-magnetic substrate layer whereby at least two successive ones of said magnetic layers could accommodate superposed or non-superposed magnetic bubbles. Non-superposed magnetic bubbles when occurring in respective different magnetic layers show repelling forces in that they are separated by an essentially finite potential barrier. For non-superposed magnetic bubbles in respective different magnetic layers the effective Faraday rotation could have different signs, so that at least three different values of the total Faraday rotation could occur. The number of magnetic layers could be three or more whereby sequences of three or more successively joined magnetic bubbles could occur. The layers could be sequentially generated by means of epitaxial growing in a known manner. The generation of magnetic bubbles could be effected by starting from a superposed magnetic bubble pair and locally enhancing the magnetic bias field whereby, depending on the composition and thickness of each of the relevant magnetic layers always a predetermined one of the elementary magnetic bubbles will collapse first whereby a non-superposed or elementary magnetic bubble remains. A non-superposed magnetic bubble can be generated, on the other hand, at a position where other relevant magnetic layers are locally absent, for example in that they have been sputtered or etched away. The magnetic bubbles could constitute a closely packed hexagonal lattice, whereby either the magnetic bubbles in a single layer could occupy all lattice positions or, alternatively, at each lattice position a magnetic bubble could be present in any of the relevant magnetic layers. Superposed and non-superposed magnetic bubbles could be guided along guide structures in different ways as relying on the fact that specific local properties of one or more of the magnetic layers do, or do not have an influence on magnetic bubbles in that specific relevant magnetic layer, or other layers, respectively. The invention can be advantageously applied for realizing a two-dimensional memory or display arrangement. U.S. Pat. No. 3,944,842 discloses a plurality of magnetic layers, each of which is capable of accommodating magnetic bubbles. The magnetic layers may abut and magnetic bubbles may vertically coincide or not coincide. In fact, this prior art discloses a device with two separate magnetic layers. It is well known that magnetic bubbles generally occur in very thin magnetic layers, having a thickness of the same order of magnitude as the magnetic bubble diameter, which may be about 20 micrometers or less in configurations that seem suitable for application. Obviously, the construction of such layers without substrate layers joined thereto would lead to a very fragile system. On the other hand, the provision of a substrate layer to improve the strength of each magnetic layer separately would render the device more bulky and costly as the thickness of the substrate layer would be in the ½ mm range. According to the invention a single substrate layer is sufficient for assuring sufficient strength to the sequence of magnetic layers joined thereto. Even if all magnetic layers according the prior art system were to constitute a joint structure, it would be necessary to provide structural unity by means of an interlayer of non-magnetic material. Furthermore, according to prior art the two magnetic plates have a master-slave type relationship: a non-superposed magnetic bubble in the slave layer only would not be viable. This renders the known system much less flexible. This is particularly obvious when the magnetic bubbles in the master layer are not guided separately, as for example by an in-plane rotating magnetic field in combination with a T-I-bar permalloy guide structure, but are guided along a continuous rail-type structure. Even if all magnetic bubbles are guided separately, the master-slave character of prior art means that in case of two magnetic layers only for each possible magnetic bubble location only three cases are possible, whereas according to the invention each possible magnetic bubble location may accommodate two bits of information by virtue of the four possible cases. Generally, for magnetic bubbles having a one-to-one relation at superposition, according to the invention each magnetic bubble location could accommodate as many bits of information as there are magnetic layers capable of accommodating magnetic bubbles. Furthermore, according to prior art the "master"-type magnetic bubbles must be well secured to a predetermined bubble location which may be switched on by external driving means. This leads to either a completely filled arrangement for the master-type bubbles, or to a rigid further positioning system such as a T-I-bar structure. According to the invention, all magnetic bubbles repel each other (except for the case of superposition, and therefore it is only required that the ensemble of all magnetic bubbles have a stable configuration instead of, as according to prior art, the ensemble of the master-type magnetic bubbles alone. This looser constrainment leads to a far greater number of possible magnetic bubble arrangements than according to prior art. Furthermore, according to prior art, magnetic bubbles across the separation between two successive layers would attract each other. According to the invention, in this case a relatively high, but essentially finite potential barrier exists, whereby non-superposition could give a stable situation. According to the invention, superposed magnetic bubbles in adjacent magnetic layers are stably joined by a magnetic compensation wall with a specific energy associated thereto. Therefore, a separation of two magnetic bubbles constituting a superposing pair is nearly impossible.

Furthermore, the possibility for existence of more than one type of magnetic bubbles in a single magnetic layer has been published elsewhere. However, the differences between the several types of magnetic bubbles relate only to the properties of the magnetic bubble wall and not to the bulk magnetization of the magnetic bubble area; therefore discrimination among them by magnetic optical means only is difficult. A further disadvantage of these so-called "hard" bubbles is a phenomenon that under rapid propagation the properties of the magnetic bubble will change irreversibly; in all these respects the magnetic bubble device according to the invention is more successful.

These and other aspects of the invention will be described hereafter, arranged according to physical properties, generation, transportation and device application of the magnetic bubbles, with relation to the following figures.

Figure 3:
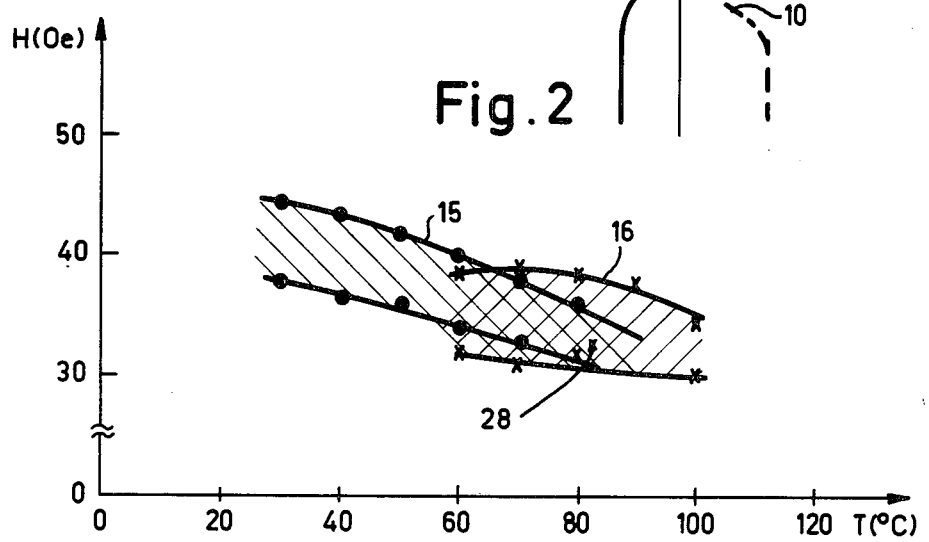
Figure 4:
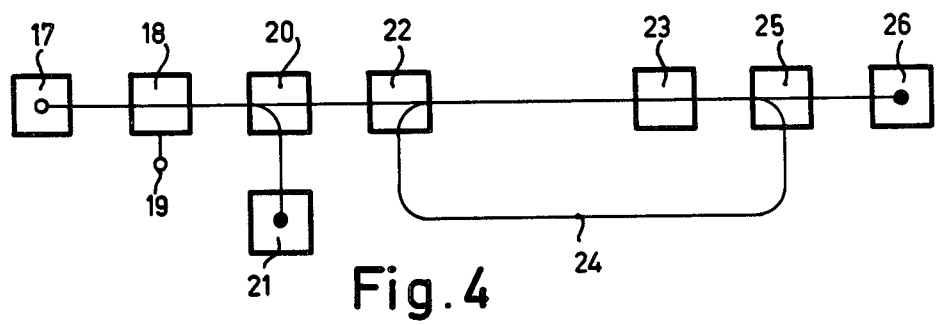
Figure 5:
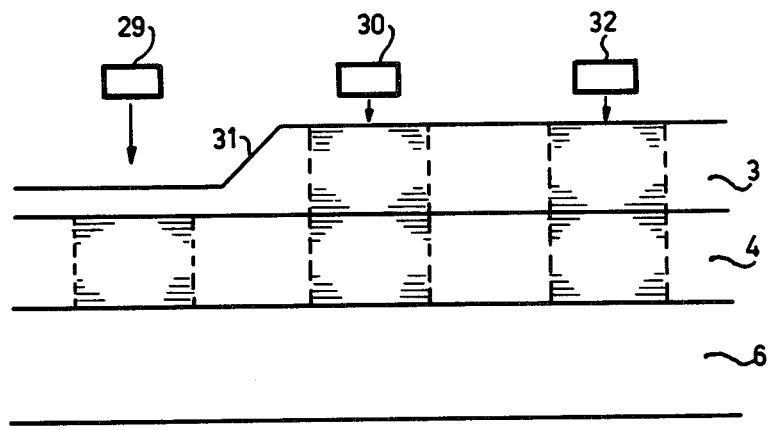
Figure 6:
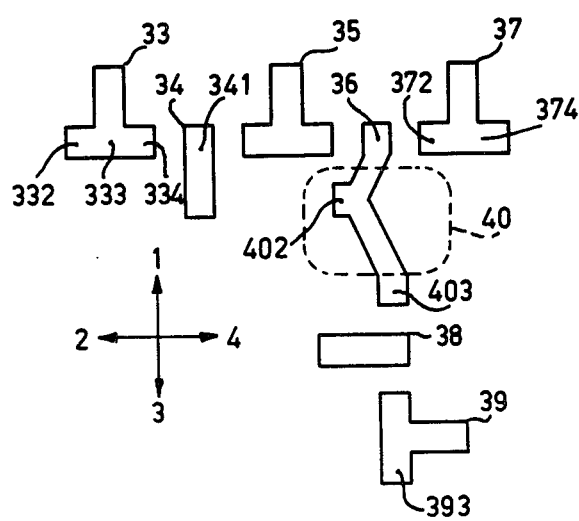
Figure 7:
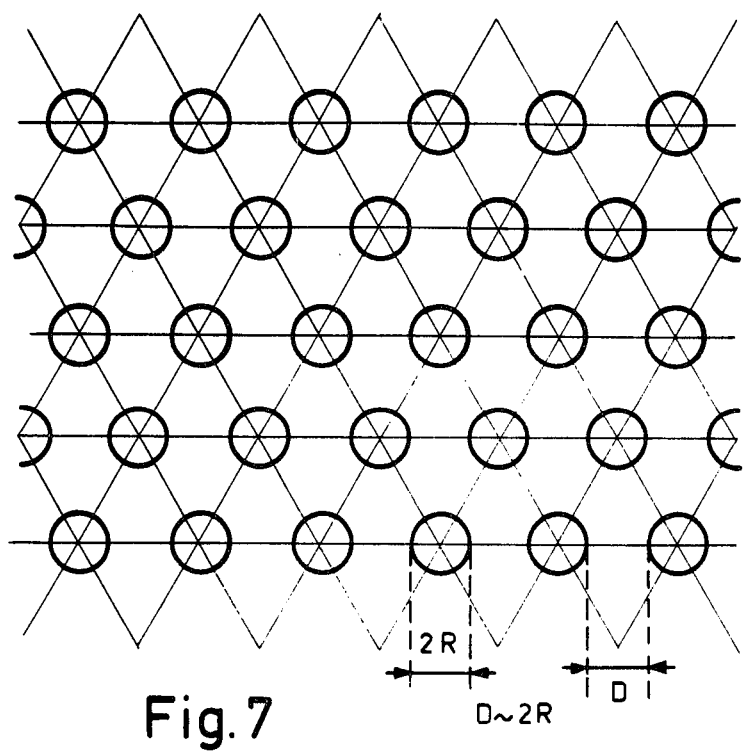
Figure 8:
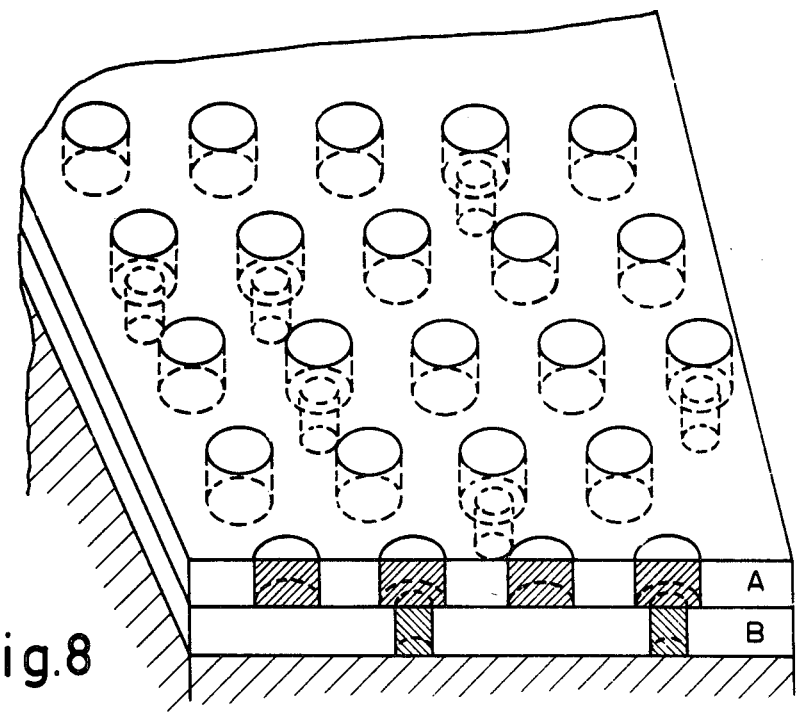
Figure 9:
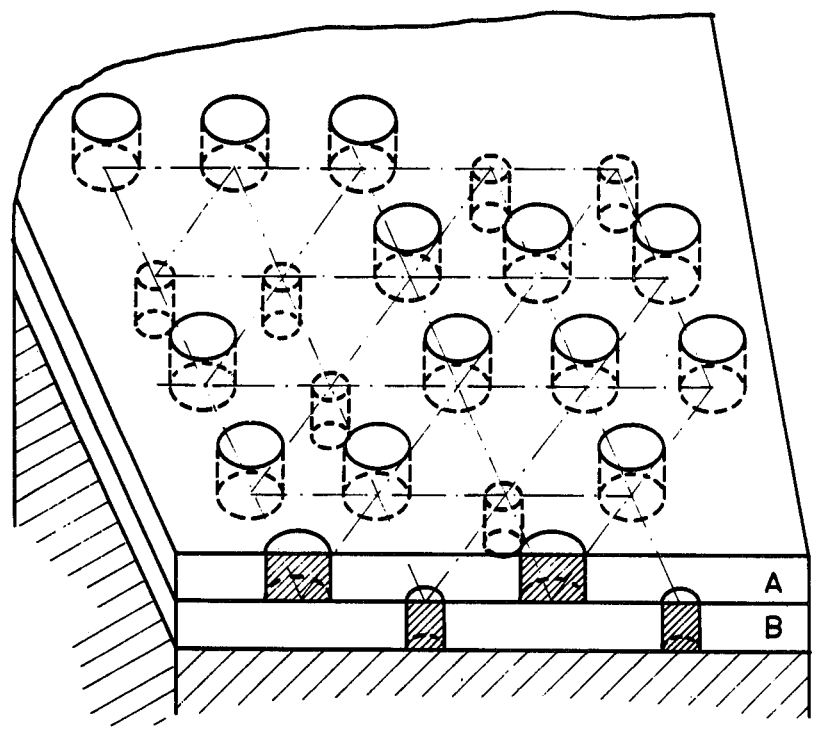
Figure 10:
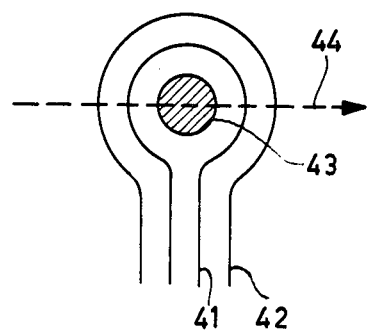

FIG. 3 shows the stability regions for an exemplary magnetic bubble configuration, FIG. 4 shows a magnetic bubble device according to the invention used as a memory, FIG. 5 shows a device for generating multiple magnetic bubble configurations, FIG. 6 shows a switching device for selectively guiding magnetic bubbles, FIG. 7 shows a closely packed hexagonal lattice of magnetic bubbles, FIG. 8 shows a perspective view of a first hexagonal arrangement of magnetic bubbles, which can be superposed or non-superposed, FIG. 9 shows a perspective view of a second hexagonal arrangement of magnetic bubbles without superposed configurations, FIG. 10 shows an electrical detector.

1. PHYSICAL PROPERTIES

The magnetic bubbles to be used in the invention may be generated in various crystalline substances, notably in liquid phase epitaxy (LPE)-grown films of yttrium iron garnet (YIG) with an overall composition of $Y_3Fe_5O_{12}$, whereby a number of other elements may be substituted in various quantities to be described more in detail below. The crystal has a basically cubic configuration, whereby three sublattices are suitable for substituting therein other ions, namely, the dodecahedral sublattice constituted by the yttrium ions (substitution by La, Ga, Sm, Nd, Pr, Gd, Eu), the octahedral sublattice constituted by 40% of the iron ions (substitution by Ga, Al) and the tetrahedral sublattice constituted by the remaining 60% of the iron ions (substition by Ge, Sr). The list of substitution elements is given only by way of example. In some cases extra substitution on the dodekahedral sublattice is necessary for charge compensation. Often, the magnetic effects of the dodecahedral sublattice may be ignored together with the magnetic influence of the oxygen atoms. Then, in these ferromagnetic garnets the magnetization M is the vector sum of oppositely directed sublattice magnetizations. If at a specific temperature, this sum is close to zero, the value of M depends critically on the distribution of ions on the octahedral and tetrahedral sublattices. Local variations of the ion distribution lead to spatial variations of M, which may even reverse its sign. The condition M=0 defines a compensation plane. Such variations of ion distribution and of saturation magnetization have been found in LPE-layers of nominal composition:

$$Y_{2.85}La_{0.15}Fe_{3.75}Ga_{1.25}O_{12}$$

whereby the compositional variations occur in a direction normal to the layer. One or more magnetic field compensation planes may occur in the film.

For manufacturing of the magnetic substance an LPE-layer of $(Y,La)_3(Fe,Ga)_5O_{12}$ garnet is grown on a Gallium-Gadolinium-Garnet-substrate in a vertical pipefurnace set-up, dipped in a vertical position without sample rotation at a temperature around 950° C. Growth takes place in the range between 15 and 20 centigrades below saturation temperature for 30 minutes. The furnace temperature is controlled to within one degree centigrade. The synthesized epi-layers have a thickness of about 5 microns and La and Ga contents of about 0.15 and 1.25 formula units respectively, according to chemical analysis. The further processing steps include the deposition, by RF-sputtering, of a $SiO_x$-layer on top of the single crystalline magnetic layer at moderate temperature. Here, the value of x (which is always $\geq 0$) lies between 1 and 2. Domains are visible in a polarizing microscope at moderate magnification (625×).

Figure 1:
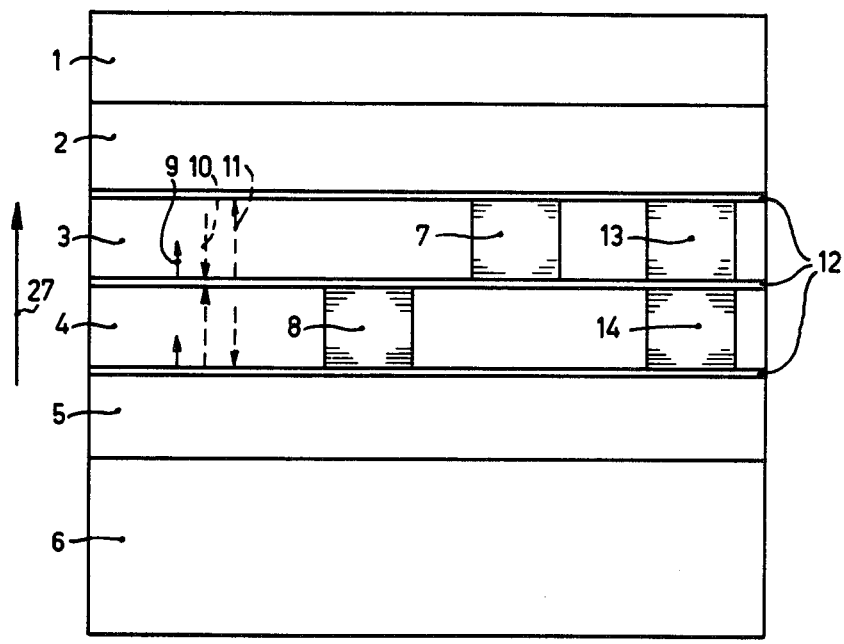
FIG. 1 shows a cross-section through a fused multilayer arrangement.
Figure 2:
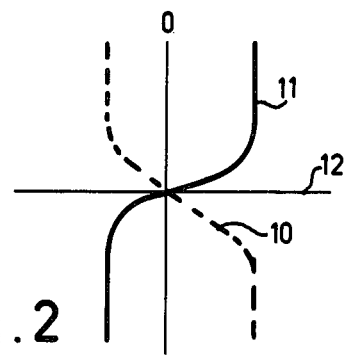
FIG. 2 shows the detailed structure of a magnetic compensation wall.

For detection of magnetic bubbles a bias field Ho is continuously applied transverse to the layers. The magnetic bubbles may be detected by applying polarized light to the layers whereby Faraday rotation occurs. A polarizing plate on the second side of the multilayer arrangement may be positioned for optimum discrimination of the resulting Faraday rotation. In this way a plurality of light transmission levels may be discriminated by some known kind of analog-to-digital transformer. FIG. 1 gives an arrangement for two separate magnetic bubbles plus a superposed pair of magnetic bubbles in a multilayer arrangement. Layer 1 is an $SiO_x$-layer as mentioned above. Layers 2, 3, 4, 5 are magnetic layers, whereby layers 3, 4 each contain two magnetic bubbles. Layer 6 is the substrate layer, whereby the thicknesses of the layers (notably layers 1, 6) are not true to scale. Outside the magnetic bubbles 7, 8, 13, 14 the octahedral sublattice magnetizations are opposite to each other as indicated by the arrows 10. The same applies to the tetrahedral sublattice magnetizations as indicated by the arrows 11, which are each time directed in opposition to the arrows 10. The preponderance of the arrows 11 in layer 3 and 10 in layer 4 results from selective doping. The magnetic influence of the dodecahedral sublattice is ignored. The bias field is directed upwards as indicated by the arrow 27. The resulting total magnetization of the relevant magnetic sublattices for layers 3, 4 is parallel to the bias field 27 as indicated by the arrows 9. Consequently, these magnetic layers are separated by a magnetic compensation wall having a structure as given in FIG. 2. Curve 11 corresponds to the vertical variation of the tetrahedral sublattice magnetization, curve 10 to the octahedral sublattice magnetization. At the compensation point 12 all fields undergo inversions. Inside the magnetic bubbles the magnetizations of the respective magnetic sublattices are directed inversely to the corresponding magnetizations outside the magnetic bubbles. Generally, the incurred Faraday rotation by transmitted light is foremost determined by the magnetization of the octahedral sublattice, and therefore, the total incurred Faraday rotations on magnetic bubble locations 7, 8 are on opposite sides of those incurred outside the magnetic bubbles. The magnetic bubbles 7, 8 show a mutual repellence when they are at a certain distance. Below a certain separation, however, an attracting force occurs, causing the two-bubble-pair 13, 14 to form a very stable configuration with respect to displacement of the two magnetic bubbles with respect to each other. These two bubbles are joined by a magnetic compensation wall. The resultant Faraday rotation shown by a two-bubble arrangement may be equal or not equal to the rotation shown by the multilayer arrangement when no magnetic bubble is present. The arrangement of FIG. 1 has two further magnetic layers 2, 5. These could accommodate further magnetic bubbles which may be superposed or not superposed to a bubble in one or more of layers 3, 4. Layers 2-5 are separated by a plurality of magnetic compensation walls 12. It is possible to generate only two magnetic layers 3, 4 separated by a single magnetic compensation wall through careful epitaxial growth on a substrate layer 6 for accommodating a set of magnetic bubbles, 7, 8, 13, 14. Also layer 1 could be absent.

In more general cases of the above, all three sublattices, including the dodecahedral sublattice could play a part. It is only necessary that one of three magnetizations be in opposition with the other two. In the cited materials this is guaranteed by the fact that octahedral and tetrahedral magnetizations are always directed in opposition to each other. Substitution of the above indicated ionic elements could be specifically distributed among the three sublattices. In this way a continuous range total Faraday rotation per layer is possible.

At three magnetically relevant sublattices three combinations are prominent for generating a resulting magnetization in a magnetic bias field, whereby each combination can be specifically substituted for generating a preferred amount of Faraday rotation. At three sublattices dodecahedral D, octahedral O, tetrahedral T (whereby e.g. O is in opposition with the other two) the following possibilities exist:

(a) $|D+T| > |O|$    $|T| > |O|$
(b) $|D+T| > |O|$    $|T| < |O|$
(c) $|D+T| < |O|$    $|T| << |O|$

In a certain temperature range, these arrangements may be constituted in the material:

$(Y_{3-x}Sm_x)_D(Fe_{2-y}Ga_y)_O(Fe_{3-z}Ga_z)_T O_{12}$.

When Ga is substituted, about 10% may go to the octahedral positions. (In another temperature range the dodecahedral magnetization may be in opposition with the resulting magnetization of octahedral and tetrahedral sublattices). Now, for the compensation of octahedral and tetrahedral sublattice magnetizations the following equation applies:

$$3 \times 5\ Fe - (z - az) \times 5\ Fe = 2 \times 5\ Fe - az \times 5\ Fe,$$

Tetrahedral    Octahedral whereby a, the fractional substitution on the octahedral sublattice, is 10%, as indicated above: y=az. If we want a nominal substitution (see before) of z=1.25, we have therefore to compensate for this 10% loss and actually to substitute z'=1.375. In a similar way it is possible to have also the dodecahedral sublattice magnetization compensated by the octahedral sublattices. For a magnetization of Sm of 0.7 Bohr magnetons (as against iron's five) we find a substitution of y+z=1.43.

Therefore, we find for the above indicated a, b, c types:

(a) y+z<1.375
(b) 1.375<y+z<1.43
(c) y+z<1.43.

Another example is generated by substituting La: $(Y_{3-x}La_x)(Fe_{2-y}Ga_y)(Fe_{3-z}Ga_z)O_{12}$, where the dodecahedral sublattice does not contain any magnetic ions. Now, exact magnetic compensation occurs at:

$2y = z(a+1) = 1.375$. (a is assumed to be 10%).

A further example is found by only substituting on the oktohedral lattice positions:

$(Y_{3-x}Ca_x)Fe_2(Fe_{3-x}Ge_x)O_{12}$, where compensation is found for $x=1$.

In the magnetic layer arrangement several possibilities exist. For three magnetic sublattices there are three possible cases (cf. the above): $a+b$, $a+c$, $b+c$. Also, further magnetic layers may be added.

The several magnetic layers can have various respective thicknesses; this influences the stability range in the magnetic field strength for any magnetic bubble; furthermore, the incurred Faraday rotation is directly proportional to the thickness of a magnetic layer. Furthermore, in opposition to the above, the dodecahedral and tetrahedal sublattice magnetizations may be opposed to each other. In fact, certain rare earth ions have their magnetizations directed in parallel to the resulting magnetization of the iron atoms, while others have their magnetizations directed in opposition. This means that the magnetization of the dodecahedral sublattice may even be directed in parallel to the magnetization of the iron ions. Furthermore the nature of the rare earth ions is determining: $Nd^{3+}$ and $Pr^{3+}$ are parallel with $Fe^{3+}$, from $Gd^{3+}$ to $Yb^{3+}$ in the periodic system antiparallelism occurs. $Eu^{3+}$ and $Sm^{3+}$ as a function of temperature have an inversion point, causing room temperature or local temperature of the magnetic layer to be influential on the functioning of the magnetic bubble device.

2. The generation of magnetic bubbles

The generation of magnetic bubbles is well known. Several methods have been indicated before. R. A. Laudise and L. G. van Uitert, Bell Laboratories Record, September 1971, page 239-243 indicate the bulk formation of magnetic bubbles by varying the bias field strength in an unrestricted environment. If the bias field increases above a certain critical value, strip domains, which are universally present in the magnetic layer at low field strengths, will show a distinct transition to magnetic bubbles.

On a local scale magnetic bubbles can be generated by splitting an existing magnetic bubble. A well controlled method is described in U.S. Pat. No. 3,958,211. There, inside a current loop applied on the magnetic layer two preferential positions for a magnetic bubble have been created, for example by means of permalloy dots. Under control of a symmetrical current waveform an existing bubble expands to cover both preferential positions. After splitting has been effected by the second half cycle of the current one of the two fission products is automatically driven outside the current loop on to a continuous rail guide structure.

A further well-controlled method has been described in application Ser. No. 692,056, filed June 21, 1976 now U.S. Pat. No. 4,091,459 which is a continuation of application Ser. No. 522,051, filed Nov. 8, 1974, now abandoned. There, a seed magnetic bubble is continuously present on a roughly square permalloy element on the magnetic layer. The square element is adjacent to a T-I-bar guide structure, whereby under influence of an in-plane rotating field in each rotation period of the magnetic field a magnetic bubble is split off and transported along the guide structure which may alos be of the continuous rail type. By temporary reversal of the sense of rotation of the magnetic field magnetic bubble switching elements can be operated for selectively determining the paths to be followed. Thereby, the information content of the transported magnetic bubble stream may be influenced.

Finally, U.S. Pat. No. 3,905,040 discloses a method for generating magnetic bubbles by locally raising the temperature of a magnetic layer through a selectively applied pulse of laser radiation. If the temperature rises above the compensation temperature a magnetic bubble will remain after this compensation temperature is passed again in downward direction. In this way a magnetic bubble is created directly instead of being transformed or split as according to the other methods. The temperature rise can be accompanied by a local lowering of the magnetic bias field. A somewhat corresponding way a magnetic bubble can be destroyed.

The magnetic bubbles for use in a device according to the invention can be generated in a corresponding manner. In the first place a multilayer arrangement as claimed would at low strength of the transverse magnetic field be filled with strip-like magnetic domains, whereby successive stripes in a magnetic layer have a magnetization alternatingly parallel and antiparallel with respect to the bias magnetic field. At higher field strengths, as depending on temperature, layer thicknesses and compositions, the above indicated transition to magnetic bubbles will occur.

FIG. 3 in this respect shows a stability region for an exemplary magnetic bubble configuration. Trace 15 depicts the stability region in the temperature-field strength domain for a double magnetic bubble (13-14 in FIG. 1); trace 16 shows the stability region for a single magnetic bubble, say type 7 in FIG. 1. If now the field is increased from the point 28, be it locally or universally, the composite magnetic bubble 13/14 will be transformed into the single magnetic bubble 7 because the other magnetic bubble would collapse. This transition can take place at 35.5 oersted in a magnetic layer of nominal composition $Y_{2.85}La_{0.15}Fe_{3.75}Ga_{1.25}O_{12}$ at room temperature whereby the remaining magnetic bubble will collapse only at, e.g. 38.5 oersted. The difference between the two collapse values 35.5 and 38.5 oersted, respectively, is sufficient for selectively collapsing only one elementary magnetic bubble of the composite magnetic bubble 13/14. The respective stability regions depend on the compositions and thicknesses of the several layers. If the thickness of one or more of the magnetic layers have a spatial variation, at the first position an increasing bias field strength may result in a transformation of a superposed magnetic bubble pair into a single magnetic bubble of type 7, at another position into one of type 8. In FIG. 3 it can be seen that this possibility exists because of the crossing of the two upper boundary curves of the stability regions.

Furthermore, if starting from 28, the temperature is increased, e.g. locally by a laser light pulse; in the same way a composite magnetic bubble pair can be transformed to an elementary magnetic bubble. Again, by selecting the starting point in the diagram of FIG. 3 the resulting elementary magnetic bubble can be chosen.

3. Propagation of single and composite magnetic bubbles

For propagation a number of mechanisms can be used which have been designed earlier for the transportation of single magnetic bubbles. In the first place the "fully controlled" method is applicable whereby each magnetic bubble is propagated along a specific guide structure. This may be a permalloy T-I-bar- or chevron-bar structure in combination with an in-plane rotating magnetic field. On the other hand, it may be a permalloy angelfish structure in combination with a pulsating action of the bias field. Furthermore, it may be an arrangement of conductors on the upper layer that are driven by pulse-type or sinusoidal currents whereby a magnetic bubble is propagated from current loop to current loop.

Furthermore, a one dimensional control is known, whereby single magnetic bubbles are propagated along one or more rail-type bubble conductors in undisturbed sequence by virtue of their mutual repellence. This same method can be used for single and composite magnetic bubbles in an arrangement of a plurality of fused magnetic layers. The continuous rail-type conductors could be formed by permalloy strips, ridges in the magnetic layer or local doping thereof.

Finally, several methods are known for the collective propagation of magnetic bubbles. It has been proposed to have a hexagonal lattice of magnetic bubbles in a single magnetic layer by pulsing straight current conductors which are disposed parallel to an elementary axis of the lattice at relative displacements of about four inter-bubble distances. The current conductors may be manufactured from aluminum, an optically transmitting medium like in $In_2O_3$:Sn, or other materials. A further method of propagating magnetic bubbles is by means of a gradient of the bias field, whereby a preferred propagation direction towards lower field areas is found. Furthermore other means of collectively propagating magnetic bubbles are known. Corresponding methods are applicable in devices according to the invention.

4. Device applications

FIG. 4 shows a magnetic bubble device according to the invention for use as a memory. The magnetic bubble guide structures are built up from discrete elements of permalloy which are positioned on top of the magnetic layers, e.g. by vapour deposition. Generators for the magnetic bias field and for a continually rotating magnetic field have not been indicated for simplification. At each rotation period of the magnetic field the magnetic bubble source 17 produces a composite magnetic bubble (of the type 13–14 in FIG. 1 to which effect a suitable arrangement of magnetic layers is provided) by splitting a continuously present composite magnetic bubble into two parts. The split-off magnetic bubble is transported along the magnetic bubble guide structure towards the collapsing element 18. Under control of a controlling signal on input 19 this collapsing element may selectively collapse one elementary magnetic bubble of a composite magnetic bubble which passes along this collapsing element, whereby an elementary magnetic bubble is then transported to the switching element 20. Consequently, cooperation between a period of the rotating magnetic field and non-occurrence of a collapse-controlling signal on input 19 a composite, superposed magnetic bubble is conserved. Obviously, some delay occurs for the magnetic bubble to be propagated from element 17 to element 18. At element 20, under control of e.g. two reverse periods of the rotating magnetic field which can rotate clock-wise or counter-clockwise, any composite or elementary magnetic bubble passing therealong, can be selectively guided towards element 22 or element 21. Element 21 is a magnetic bubble annihilator, wherein any magnetic bubble arriving therein will vanish. Element 22 is a converging switch having two inputs from elements 20 and 25 and one output towards element 23. After passing the converging switch 22 any elementary or composite magnetic bubble is stored on the storage ring-line 24, while being continuously propagated therealong under control of the prevailing rotation of the in-plane magnetic field. The element 25 is a switching element analoguous to switching element 20: under control of e.g. two periods of reversed rotation of the in-plane magnetic field any magnetic bubble will then be transported towards magnetic bubble annihilator 26, wherein annihilation takes place. Switching elements 20, 25 may be operable separately in that the reversed rotation starts at different orientations of the in-plane magnetic field. The element 23 is a magnetic bubble detector. There, locally a source of polarized light is disposed. The polarization vector is rotated by magneto-optical effects in the magnetic layers as depending on the local magnetization direction therein. Therefore, the overall rotation is determined by the aggregate magnetization directions in the several magnetic layers. By means of a polarizing filter at the detecting side of the magnetic multilayer arrangement and an illumination detector a signal can be produced. The amplitude of this signal is directly indicative for the structure of the locally present magnetic bubble arrangement, if any. The organization of the above described memory may be modified, e.g. according to a major-loop/minor-loop organization. Also decoding apparatus, a plurality of detectors, switching elements, sources and collapsing elements may be provided for implementing the invention.

FIG. 5 shows a detailed structure of a device for generating multiple magnetic bubble configurations. Here, a three layer arrangement of only two magnetic layers 3, 4, and a non-magnetic substrate layer 6 is present. Elements 29, 30 are magnetic bubble sources, e.g. as described above. However at the source 29 the local thickness of layer 3 is insufficient for sustaining a magnetic bubble, as opposed to the thickness of layer 4 at element 29 and the thicknesses of both layers 3, 4 at the location of the magnetic bubble source 30. Thus at the latter element composite superposed magnetic bubble pairs can be selectively generated. The device may contain a magnetic bubble guide structure, not indicated, existing e.g. of T-I-bars. The magnetic bubbles generated at source 30 may be propagated towards collapsing element 32. This element may be constituted of a magnetic loop which may be driven by a current pulse for selectively collapsing the locally present elementary magnetic bubble in magnetic layer 4, so that locally only the single magnetic bubble in layer 3 remains. Thereafter, the two types of elementary bubbles, the composite magnetic bubbles, possibly together with interleaved void magnetic bubble positions can be propagated towards respective inputs of converging switches of the type of element 22 in FIG. 4 for generating a magnetic bubble stream with a two bit information content per magnetic bubble. Alternately the three elements 29, 30, 31 can be sequentially disposed along a single magnetic bubble guiding structure; the slope at 31 does not produce a repelling action on a magnetic bubble in layer 4 being propagated from left to right. In like manner a magnetic bubble source of the type described can be disposed at a location where layer 4 is too thin to accommodate stable magnetic bubbles. The three sources could be situated at three magnetic bubble guide structures leading to a converging switch arrangement. The information content of the resulting bubble stream depends on the synchronized cooperation of the respective magnetic bubbles and collapsing elements, together with the magnetic bubble propagation mechanism.

FIG. 6 shows a switching device for selectively guiding magnetic bubbles. The guiding structure consists of a number of discrete permalloy elements, deposited, for example, on top of layer 1 in FIG. 1. The magnetic and non-magnetic layers have not been indicated for simplicity. The direction of the in-plane rotating field is indicated by arrows 1-4. If this field is directed according to arrow 2, a magnetic bubble may be situated on element 33 at position 332. If the field rotates along arrow 3, the magnetic bubble moves to position 333. A further half period guides the magnetic bubble towards positions 334, 341, and a second full period to positions 352, 353, 354, 361. The broken line 40 indicates the local absence (as in FIG. 5) of one of the magnetic layers, e.g. layer 3. Now an elementary magnetic bubble in layer 4 would not be influenced by this absence. The same applies, if three or more magnetic layers are present, for a superposed magnetic bubble arrangement having no constituting elementary magnetic bubble in layer 3. Then, after a further $\frac{1}{4}$-period of rotation the said magnetic bubble would then be transported to position 402, which is the next magnetically closest preferred position. This being closer is determined by both the geometrical distance and the influences of the permalloy material. Next the magnetic bubble proceeds to position 403 and successively further, on to position 393. If however an elementary magnetic bubble in layer 3 would be repelled by the slope where the transition to the absence of layer 3 occurs (cf. FIG. 5). The same applies for a superposed magnetic bubble arrangement having a constituting elementary magnetic bubble in layer 3. Then, after position 361 the next preferred positions are 372-374.

In like manner a diverging switch can be constructed wherein a partial void in layer 4 occurs. In case there are three or more fused magnetic layers partial voids can be superposed in two or more magnetic layers whereby a wide variety of selective driving of the magnetic bubbles if effected. Furthermore, the properties of layers 2,5 in FIG. 1 can be used for selectively guiding elementary and composite magnetic bubbles. The selective driving can be used for selective detection of the magnetic bubbles: those of a specified configuration only will be diverged to a specific detector. Construction of these magnetic layers is not difficult. The voids may be created by sputtering off locally. If necessary, the next magnetic layer may be grown epitaxially on this pre-structured layer.

FIG. 7 shows a closely packed hexagonal lattice of magnetic bubbles. This lattice can be formed by one or more devices for serially generating a plurality of magnetic bubbles as described before. It has been found that high bubble densities can be produced in the case of composite bubbles, because these are very stable against disturbing effects caused by neighbouring magnetic bubbles. As indicated in FIG. 7, the spacing between successive magnetic bubbles may be about equal to the magnetic bubble diameter.

FIG. 8 shows a perspective view of a first hexagonal lattice arrangement of magnetic bubble. The magnetic bubbles in layer A form a completely occupied magnetic bubble lattice. At each magnetic bubble location in layer A a magnetic bubble in layer B may, or may not be present. In this way a close-packed arrangement of magnetic bubbles is realized. The substrate layer has been indicated by cross-hatching.

FIG. 9 shows a perspective view of a second hexagonal lattice arrangement of magnetic bubbles. Now, only elementary magnetic bubbles occur, either in the A-layer or in the B-layer. This arrangement is advantageous in a memory environment because a parity check is possible: the number of elementary magnetic bubbles on any location is always equal to one. Furthermore, the diameters of the magnetic bubbles in the A- and B-layers may be quite different as indicated. Alternatively, depending on the thicknesses and compositions of the magnetic layers, they could be roughly equal. Furthermore, it is possible to adapt the material properties in such a way that the repelling forces between two bubbles are independent of the types of these bubbles. Notably in the arrangement according to FIG. 9 a very regular and stable lattice is formed thereby.

The arrangements of FIGS. 8, 9 can be visualized by two polarized plates on opposite sides of the multilayer arrangement for viewing a plurality of magnetic bubble locations together. In this way a two-dimensional display device is made.

FIG. 10 shows a detector arrangement for electrically discriminating among the several magnetic bubble categories. Magnetic bubbles are propagated along the crude structure 44. When detection is necessary, conductor 41 may carry a current pulse for collapsing magnetic bubble 43. Thereupon conductor 42 will receive an induction pulse which specifically depends on the amount of reversed flux under influence of this collapsing. In this way discrimination is possible among the two magnetic bubble types of FIG. 1. Furthermore, collapsing can be done in a selective way: the field pulse, applied in the system of FIG. 9, is high enough for collapsing only one of the two magnetic bubble types. This method consequently leads to destructive read-out. However, both methods for discrimination can be used simultaneously.

The invention may be used as a memory device, as has been indicated. Thereby, generation and detector means may be located stationary with respect to the magnetic layers, while the magnetic bubbles are propagated in the magnetic layers. Alternatively, the magnetic bubbles may be stationary within the magnetic layers while the latter ones are driven along generator and detector means, e.g. in the way of a magnetic disk memory.

What is claimed is:

1. A magnetic bubble device comprising: a non-magnetic substrate layer, a first magnetic layer joined thereto capable of accommodating magnetic bubbles, a second magnetic layer joined to said first magnetic layer capable of accommodating second magnetic bubbles, magnetic field generating means for generating a steady magnetic field component directed substantially transverse to said layers, first generator means having a first transverse position with respect to said layers for serially generating a plurality of magnetic bubbles at said first position in said first magnetic layer, second generator means having a second transverse position with respect to said layers for serially generating a plurality of magnetic bubbles at said second position in said second magnetic layer, said first and second transverse positions having a predetermined fixed spatial disposition relative to each other, control means for sequentially and selectively controlling cooperation between said first and second generating means for upon momentary cooperation generating superposed magnetic bubbles in said first and second magnetic layers which superposed magnetic bubbles are energetically joined through a magnetic compensation wall, whereby non-cooperation between said first and second generator means produces mutually repelling single magnetic bubbles in any of said magnetic layers which are furthermore repelling towards any superposed magnetic bubble arrangement, said device further comprising transport means for generating a relative displacement between any magnetic bubble generated by said first and second generator means in one case and said first and second positions in another case, whereby said magnetic layers each accommodate at least two magnetic crystalline sublattices having respective first and second complementary magnetizations which are directed substantially in opposition with each other, said device further comprising detector means for selectively detecting single or superposed magnetic bubbles, and magnetic bubble annihilator means having a predetermined third position and operative for serially annihilating any single magnetic bubble or superposed magnetic bubble appearing at said third position.

2. A magnetic bubble device as claimed in claim 1, wherein said first magnetic layer is joined to said substrate layer by means of an intermediate magnetic layer capable of accommodating magnetic bubbles, third generator means being provided having a third position with respect to said layers for serially and selectively generating a plurality of magnetic bubbles at said third position in said layer.

3. A magnetic bubble device as claimed in claim 1 wherein a third magnetic layer capable of accommodating magnetic bubbles is joined to said second magnetic layer, fourth generator means being provided having a fourth position with respect to said layers for serially and selectively generating a plurality of magnetic bubbles at said fourth position in said fourth magnetic layer.

4. A magnetic bubble device as claimed in claim 1 where in non-superposed magnetic bubbles in different magnetic layers are separated by a potential barrier.

5. A magnetic bubble device as claimed in claim 1, where in said layers are fused to each other by epitaxial growth.

6. A magnetic bubble device as claimed in claim 1, wherein superposed magnetic bubbles in adjacent magnetic layers are joined by a magnetic compensation wall.

7. A magnetic bubble device as claimed in claim 1, wherein said magnetic bubble annihilator means is adapted for locally applying a heat pulse to at least one of said magnetic layers.

8. A magnetic bubble device as claimed in claim 1, wherein said first and second generator means are stationary with respect to said magnetic layers and wherein said device further comprises magnetic bubble propagation means.

9. A magnetic bubble device as claimed in claim 8 wherein said first generator means comprises a locally disposed first generator at a position where said second magnetic layer is locally defective.

10. A magnetic bubble device as claimed in claim 8 wherein said second generator means comprises a locally disposed second generator at a position where said first magnetic layer is locally defective.

11. A magnetic bubble:device as claimed in claim 8, wherein said first and second generator means comprise a generator for coincidentally generating a superposed magnetic bubble pair in said first and second magnetic layers, and including a magnetic bubble transport path for transporting magnetic bubbles therealong, and field enhancing means disposed locally along said transport path for enhancing said steady magnetic field then passing therealong a predetermined magnetic bubble of constant disposition within said pair is collapsed.

12. A magnetic bubble device as claimed in claim 4, wherein said generator means comprise a generator at a position where at least one of said magnetic layers is locally defective.

13. A magnetic bubble device as claimed in claim 8 wherein magnetic bubble guide means are present in at least one of said magnetic layers for guiding a magnetic bubble in a first magnetic layer differently from a magnetic bubble in a second magnetic layer.

14. A magnetic bubble device as claimed in claim 13 wherein said bubble guide means include diverging switch means for driving magnetic bubbles in respective magnetic layers along different paths.

15. A magnetic bubble device as claimed in claim 13 wherein said guide means are adapted for guiding a superposed pair of magnetic bubbles differently from a magnetic bubble in said second magnetic layer.

16. A magnetic bubble device as claimed in claim 13 wherein said guide means are adapted for guiding a superposed pair of magnetic bubbles differently from a magnetic bubble in said first magnetic layer.

17. A magnetic bubble device comprising: a non-magnetic substrate layer, a first magnetic layer joined thereto capable of accommodating magnetic bubbles, a second magnetic layer joined to said first magnetic layer capable of accommodating second magnetic bubbles, magnetic field generating means for generating a steady magnetic field component directed substantially transverse to said layers, first generator means having a first transverse position with respect to said layers for serially generating a plurality of magnetic bubbles at said first position in said first magnetic layer, second generator means having a second transverse position with respect to said layers for serially generating a plurality of magnetic bubbles at said second position in said second magnetic layer, said generating means being adapted for generating a closely spaced hexagonal magnetic bubble lattice wherein at each lattice point a magnetic bubble is present in at least one of said magnetic layers, said first and second transverse positions having a predetermined fixed spatial disposition relative to each other, control means for sequentially and selectively controlling cooperation between said first and second generating means for upon momentary cooperation generating superposed magnetic bubbles in said first and second magnetic layers which superposed magnetic bubbles are energetically joined through a magnetic compensation wall, whereby non-coopration between said first and second generator means produces mutually repelling single magnetic bubbles in any of said magnetic layers which are furthermore repelling towards any superposed magnetic bubble arrangement, said device further comprising transport means for generating a relative displacement between any magnetic bubble generated by said first and second generator means in one case and said first and second positions in another case, whereby said magnetic layers each accommodate at least two magnetic crystalline sublattices having respective first and second complementary magnetizations which are directed substantially in opposition with each other, said device further comprising detector means for selectively detecting single or superposed magnetic bubbles, and magnetic bubble annihilator means having a predetermined third position and operative for serially annihilating any single magnetic bubble or superposed magnetic bubble appearing at said third position.

18. A magnetic bubble device as claimed in claim 17 wherein at each lattice point a magnetic bubble is present in exactly one of said magnetic layers.

19. A magnetic bubble device as claimed in claim 17, wherein said generator means are adapted for generating a closely spaced hexagonal magnetic bubble lattice in at least one said magnetic layers.

20. A magnetic bubble device as claimed in claim 19 wherein the lattice constant of said magnetic bubble relative is less than 2½ times the magnetic bubble diameter.

21. A magnetic bubble device as claimed in claim 17, wherein said magnetic crystalline sublattices each have specific optical activities, which for each magnetic layer are oppositely directed with respect to each other, and wherein said magnetic layers are doped for producing for each layer at corresponding magnetizations respective different optical activities, and wherein said detector means is adapted for specifically discriminating any one of a predetermined number of Faraday rotation vectors.

22. A magnetic bubble device as claimed in claim 21 comprising external optical detection means, the Faraday rotation for a pair of superposed magnetic bubbles and for non-superposed magnetic bubbles in each respective one of said magnetic layers having at least three different values, respectively.

23. A magnetic bubble device as claimed in claim 22, wherein said optical detection means is adapted for simultaneously visualizing a plurality of magnetic bubbles on respective magnetic bubble locations.

* * * * *

UNITED STATES PATENT AND TRADEMARK OFFICE
CERTIFICATE OF CORRECTION

PATENT NO. : 4,151,602
DATED : April 24, 1979
INVENTOR(S) : JAN HAISMA ET AL

It is certified that error appears in the above-identified patent and that said Letters Patent are hereby corrected as shown below:

Claim 4, line 2, change "where in" to --wherein--

Claim 5, line 2, change "where in" to --wherein--

Claim 12, line 1, change "4" to --11--

Claim 20, line 3, change "relative" to --lattice--

Signed and Sealed this

Second Day of October 1979

[SEAL]

Attest:

RUTH C. MASON
Attesting Officer

LUTRELLE F. PARKER
Acting Commissioner of Patents and Trademarks